United States Patent
Li et al.

(10) Patent No.: US 8,611,033 B2
(45) Date of Patent: Dec. 17, 2013

(54) SYSTEMS AND METHODS FOR SELECTIVE DECODER INPUT DATA PROCESSING

(75) Inventors: Zongwang Li, San Jose, CA (US); Fan Zhang, Milpitas, CA (US); Wu Chang, Santa Clara, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 335 days.

(21) Appl. No.: 13/088,146

(22) Filed: Apr. 15, 2011

(65) Prior Publication Data

US 2012/0262814 A1    Oct. 18, 2012

(51) Int. Cl.
*G11B 5/09* (2006.01)
*H03M 13/00* (2006.01)

(52) U.S. Cl.
USPC .................................... 360/53; 714/774

(58) Field of Classification Search
None
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama et al. |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler et al. |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,768,044 A | 6/1998 | Hetzler et al. |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Daniell L Negron
(74) *Attorney, Agent, or Firm* — Hamilton DeSanctis & Cha

(57) ABSTRACT

Various embodiments of the present invention provide systems and methods for data processing. As an example, a data processing circuit is disclosed that includes: a data detector circuit, a data decoder circuit, and a multi-path circuit. The data detector circuit is operable to apply a data detection algorithm to a data input and a decoder output to yield a detected output. The data decoder circuit is operable to apply a decoding algorithm to a decoder input to yield the decoder output and a status input. The multi-path circuit is operable to provide the decoder input based at least in part on the detected output and the status input.

21 Claims, 5 Drawing Sheets

(56) References Cited

U.S. PATENT DOCUMENTS

| | | |
|---|---|---|
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,625,775 B1 | 9/2003 | Kim |
| 6,657,803 B1 | 12/2003 | Ling et al. |
| 6,671,404 B1 | 12/2003 | Katawani et al. |
| 6,748,034 B2 | 6/2004 | Hattori et al. |
| 6,757,862 B1 | 6/2004 | Marianetti |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,980,382 B2 | 12/2005 | Hirano et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greenberg et al. |
| 7,093,179 B2 | 8/2006 | Shea |
| 7,113,356 B1 | 9/2006 | Wu |
| 7,136,244 B1 | 11/2006 | Rothbert |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghaven et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,523,375 B2 | 4/2009 | Spencer |
| 7,587,657 B2 | 9/2009 | Haratsch |
| 7,590,168 B2 | 9/2009 | Raghaven et al. |
| 7,590,927 B1 | 9/2009 | Shih et al. |
| 7,702,989 B2 | 4/2010 | Graef et al. |
| 7,712,008 B2 | 5/2010 | Song et al. |
| 7,738,201 B2 | 6/2010 | Jin et al. |
| 7,752,523 B1 | 7/2010 | Chaichanavong |
| 7,801,200 B2 | 9/2010 | Tan |
| 7,802,163 B2 | 9/2010 | Tan |
| 8,291,299 B2 * | 10/2012 | Li et al. .......................... 714/774 |
| 2003/0063405 A1 | 4/2003 | Jin et al. |
| 2003/0081693 A1 | 5/2003 | Raghaven et al. |
| 2003/0087634 A1 | 5/2003 | Raghaven et al. |
| 2003/0112896 A1 | 6/2003 | Raghaven et al. |
| 2003/0134607 A1 | 7/2003 | Raghaven et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0078399 A1 | 4/2005 | Fung et al. |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Vila Casado et al. |
| 2007/0047121 A1 | 3/2007 | Eleftheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2009/0185643 A1 | 7/2009 | Fitzpatrick |
| 2009/0199071 A1 | 8/2009 | Graef |
| 2009/0235116 A1 | 9/2009 | Tan et al. |
| 2009/0235146 A1 | 9/2009 | Tan et al. |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghaven et al. |
| 2010/0042877 A1 | 2/2010 | Tan |
| 2010/0042890 A1 | 2/2010 | Gunnam |
| 2010/0042905 A1 * | 2/2010 | Gunnam et al. .............. 714/780 |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |
| 2011/0075569 A1 | 3/2011 | Marrow et al. |
| 2011/0080211 A1 | 4/2011 | Yang et al. |
| 2011/0167246 A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed 90-21, 2010, Liu, et al.
U.S. Appl. No. 12/901,816, filed Oct. 11, 2010, Liu, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.

(56) References Cited

OTHER PUBLICATIONS

U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 201, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, files Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding" [online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)" (dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matrix in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MPA and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR SELECTIVE DECODER INPUT DATA PROCESSING

BACKGROUND OF THE INVENTION

The present inventions are related to systems and methods for data processing.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by noise, data errors and other issues arising in the data transfer. Turning to FIG. 1, a data processing circuit 100 is shown that includes a data detector circuit 130, an adder circuit 140 and a data decoder circuit 150. A data input 101 is received by data detector circuit 130 along with a data output 152 from data decoder circuit 150, and a resulting detected output 132 is provided to adder circuit 140. Adder circuit 140 subtracts data output 152 from detected output 132 to yield a decoder input 142. Decoder circuit 140 processes decoder input 140 to yield data output 152. In some cases, processing a data input may require many iterations through the combination of data detector circuit 130 and data decoder circuit 150 to recover an original data set. In various cases an insufficient number of iterations may be available rendering recovery of the original data set impossible.

Hence, for at least the aforementioned reasons, there exists a need in the art for advanced systems and methods for data processing.

BRIEF SUMMARY OF THE INVENTION

The present inventions are related to systems and methods for data processing.

Various embodiments of the present invention provide data processing circuits that include: a data detector circuit, a data decoder circuit, and a multi-path circuit. The data detector circuit is operable to apply a data detection algorithm to a data input and a decoder output to yield a detected output. The data decoder circuit is operable to apply a decoding algorithm to a decoder input to yield the decoder output and a status input. The multi-path circuit is operable to provide the decoder input based at least in part on the detected output and the status input. In some instances of the aforementioned embodiments, the data processing circuit is implemented as an integrated circuit. In various instances of the aforementioned embodiments, the data processing circuit is incorporated in a storage device.

In some instances of the aforementioned embodiments, the status input includes a number of unsatisfied decoder check equations. In such instances, the multi-path circuit includes a threshold detection circuit and a selector circuit. The threshold detection circuit is operable to compare the number of unsatisfied decoder check equations with a threshold value to yield a comparator output. The selector circuit is operable to provide one of an interim detected output and the detected output less the decoder output as a selected output based at least in part on the comparator output. In particular cases, the selector circuit is a multiplexer circuit. In various cases, the multi-path circuit further includes an iteration count circuit operable to indicate a number of iterations of the data decoder circuit mod N to yield a divided output. In such cases, the selector circuit is operable to provide the one of the interim detected output when the divided output is equal to zero and the number of unsatisfied decoder check equations is less than the threshold value. In one particular case, N is four.

In some instances of the aforementioned embodiments, the threshold detection circuit is a first threshold detection circuit, the comparator output is a first comparator output, the selector circuit is a first selector circuit, the threshold value is a first threshold value, and the multi-path circuit further includes a second threshold circuit operable to compare the number of unsatisfied decoder check equations with a second threshold value to yield a second comparator output, and a second selector circuit that is operable to provide one of the interim detected output and a reconstructed output as the interim detected output based at least in part on the second comparator output. In some cases, the reconstructed output is calculated in accordance with the following equation:

$$\{(\text{Sign of Detected Output}), (-2)(\text{Number of Unsatisfied Decoder Check Equations})\}.$$

In some cases, the second selector circuit is operable to provide the reconstructed output as the interim detected output when second comparator output indicates that the number of unsatisfied decoder check equations is less than the first threshold value. In various cases, both the first threshold value and the second threshold value are programmable.

Some embodiments of the present invention provide methods for data processing that include: receiving a data input; performing a data detection on the data input and a decoder output to yield a detected output; generating two or more preliminary inputs based at least in part on the detected output; selecting one of the two or more preliminary inputs as a decoder input based at least in part on a number of unsatisfied decoder check equations; and performing a data decode on the decoder input to yield the decoder output and the number of unsatisfied decoder check equations.

Other embodiments of the present invention provide storage systems that include: a storage medium; a read/write head assembly operable to sense information from the storage medium and to provide a corresponding continuous signal; an analog front end circuit operable to process the continuous signal to yield an analog input; an analog to digital converter circuit operable to sample the analog input synchronous to a sampling clock to yield a set of digital samples; an equalizer circuit operable to equalize the set of digital samples and to provide a corresponding equalized output; a data detector circuit operable to apply a data detection algorithm to the equalized output and a decoder output to yield a detected output; a data decoder circuit operable to apply a decoding algorithm to a decoder input to yield the decoder output and a status input; and a multi-path circuit operable to provide the decoder input based at least in part on the detected output and the status input.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple

DETAILED DESCRIPTION OF THE INVENTION

The present inventions are related to systems and methods for data processing.

Various embodiments of the present invention provide data processing circuits that include a data detector circuit, a data decoder circuit, and a multi-path detector to decoder data processing circuit. The multi-path detector to decoder data processing circuit is operable to generate an input to the decoder based at least in part on an output from the detector, the number of iterations of the combination of the data detector circuit and data decoder circuit, and/or the number of errors remaining after a prior iteration of the combination of the data detector circuit and data decoder circuit. Such an approach an ability for the data processing circuit to converge on the originally written data is improved.

Figure 1:
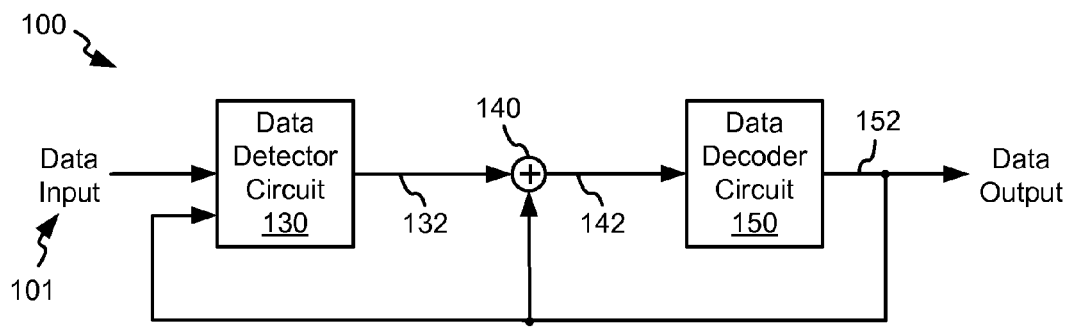
FIG. 1 shows a prior art data processing circuit.
Figure 2:
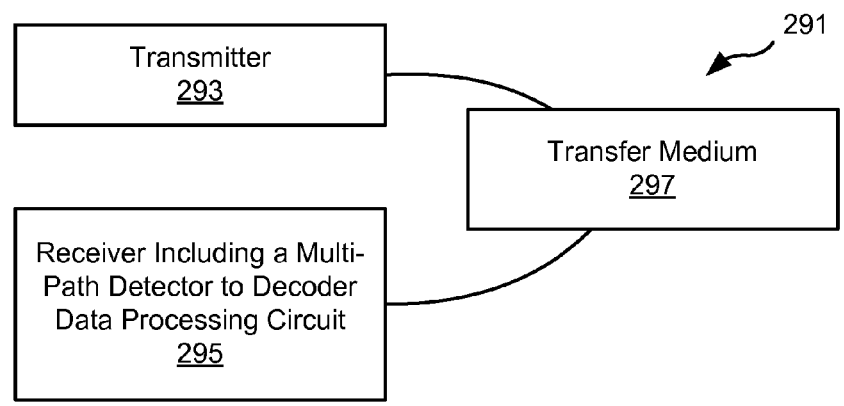
FIG. 2 shows a data transmission system including a receiver with a multi-path detector to decoder data processing circuit is shown in accordance with different embodiments of the present invention.

Turning to FIG. 2, a data transmission system 200 including a receiver 295 with a multi-path detector to decoder data processing circuit is shown in accordance with different embodiments of the present invention. Data transmission system 200 includes a transmitter 293 that is operable to transmit encoded information via a transfer medium 297 as is known in the art. The encoded data is received from transfer medium 297 by receiver 295. Receiver 295 incorporates a multi-path detector to decoder data processing circuit. Such a multi-path detector to decoder data processing circuit may be implemented similar to any of those described below in relation to FIGS. 4-5, and/or may operate similar to either of the method discussed below in relation to FIG. 6.

Figure 3:
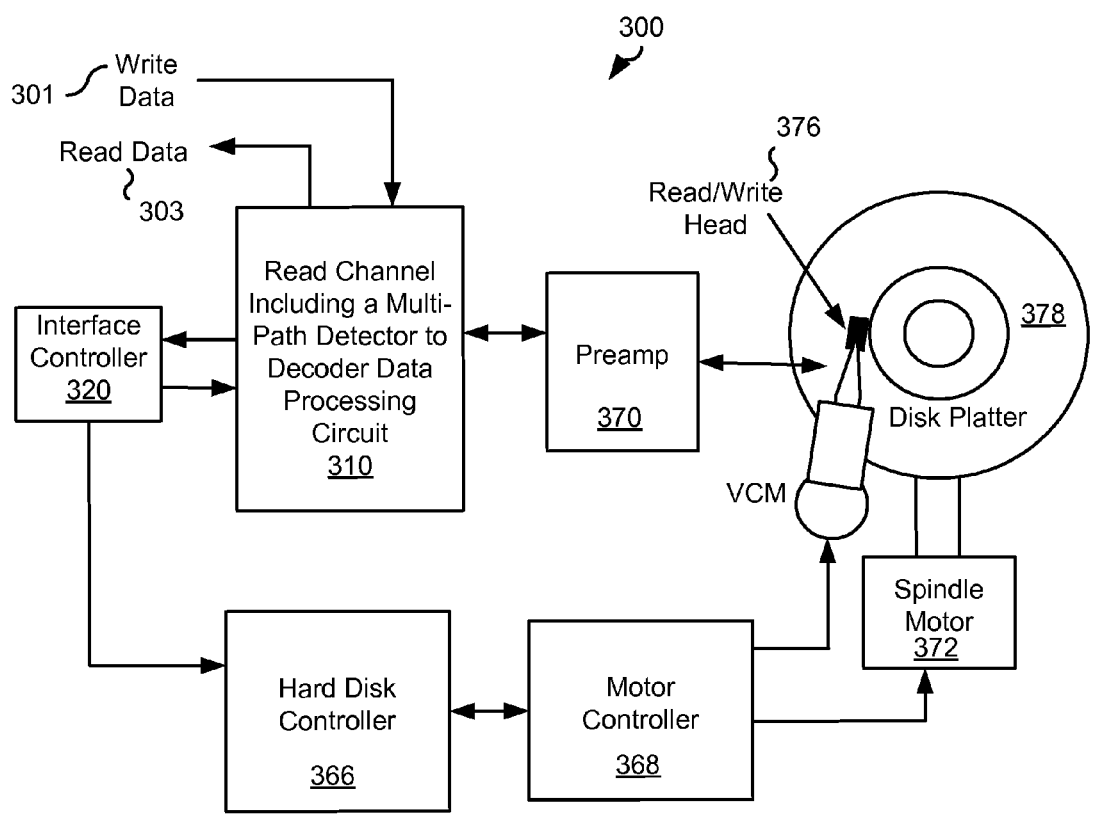
FIG. 3 shows a storage system including a read channel with a multi-path detector to decoder data processing circuit in accordance with various embodiments of the present invention.

Turning to FIG. 3, a storage system 300 including a read channel circuit 310 with a multi-path detector to decoder data processing circuit in accordance with various embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 376 is positioned adjacent the proper data track, magnetic signals representing data on disk platter 378 are sensed by read/write head assembly 176 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. As part of processing the received information, read channel circuit 310 utilizes the multi-path detector to decoder data processing circuit. Such a multi-path detector to decoder data processing circuit may be implemented similar to, but are not limited to, any of those described below in relation to FIGS. 4-5, and/or may operate similar to, but is not limited to, the method discussed below in relation to FIG. 6. A write operation is substantially the opposite of the preceding read operation with write data 301 being provided to read channel circuit 310. This data is then encoded and written to disk platter 378.

It should be noted that storage system 300 may be integrated into a larger storage system such as, for example, a RAID (redundant array of inexpensive disks or redundant array of independent disks) based storage system. It should also be noted that various functions or blocks of storage system 100 may be implemented in either software or firmware, while other functions or blocks are implemented in hardware.

Figure 4:
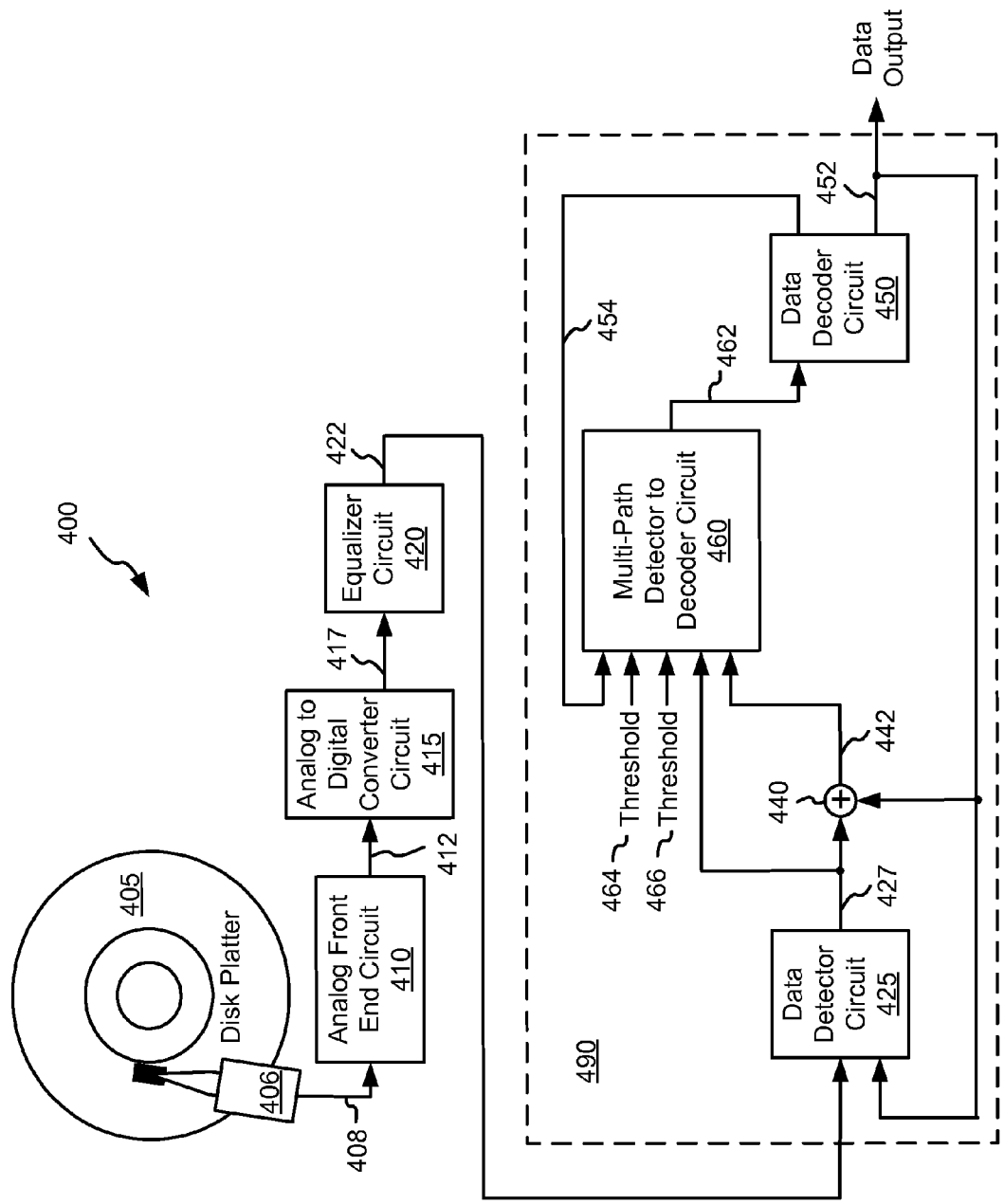
FIG. 4 shows a storage device including a data processing circuit including a multi-path data detector to data decoder circuit in accordance with various embodiments of the present invention.

Turning to FIG. 4, a storage device 400 is shown that includes a data processing circuit 490 including a multi-path data detector to data decoder circuit 460 in accordance with various embodiments of the present invention. Storage device 400 includes an analog front end circuit 410 that receives an analog signal 408 from a read/write head assembly 406 disposed in relation to a disk platter 405. Disk platter 405 stores information that may be sensed by read/write head assembly 406. Analog front end circuit 410 processes analog signal 408 and provides a processed analog signal 412 to an analog to digital converter circuit 420. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410.

Analog to digital converter circuit 415 converts processed analog signal 412 into a corresponding series of digital samples 417. Analog to digital converter circuit 415 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 417 are provided to an equalizer circuit 420. Equalizer circuit 420 applies an equalization algorithm to digital samples 417 to yield an equalized output 422. In some embodiments of the present invention, equalizer circuit 420 is a digital finite impulse response filter circuit as are known in the art.

Equalized output 422 is provided to a data processing circuit 490 that includes a multi-path data detector 460 to a data decoder circuit 450 in accordance with various embodiments of the present invention. Data detector circuit 425 performs a data detection algorithm on equalized output 422 as aided by a decoder output 452 that includes soft information derived from the most recent iteration of the detector/decoder processing of the received data. On the first iteration applied to equalized output 422, decoder output 452 is zero. For later iterations, decoder output 452 includes meaningful information that guides data detector circuit 425. In some embodiments of the present invention, data detector circuit 425 is a Viterbi algorithm data detector circuit. In other embodiments of the present invention, data detector circuit 425 is a maximum a posteriori data detector circuit. Based upon the disclosure provided herein, one of ordinary skill in the art will recognize a variety of data detector circuits that may be utilized in accordance with different embodiments of the present invention. Data detector circuit 425 provides the result of the detection algorithm as a detected output 427.

Detected output 427 is provided to an adder circuit 440 that subtracts decoder output 452 from detected output 427 to yield a sum 442. Sum 442 and detected output 427 are provided to multi-path data detector to data decoder circuit 460 that selects one of a number of inputs that are provided to data a decoder circuit 450 as decoder input 462. In particular, decoder input 462 is generated based upon a status input 464 from data decoder circuit 450, threshold 464, threshold 466, detected output 427 and sum 442. Additional detail about the operation of multi-path data detector to data decoder circuit 460 is provided below in relation to FIG. 5.

In some embodiments of the present invention, data decoder circuit 450 is a low density parity check decoder circuit. Based upon the disclosure provided herein, one of ordinary skill in the art will recognize a variety of data decoder circuits that may be used in relation to different embodiments of the present invention. Decoder circuit 450 applies a decoding algorithm to decoder input 462 to yield decoder output 452. Decoder output 452 is fed back to data detector circuit 425 and adder circuit 440. In addition, data decoder circuit 450 provides status input 454. Status input 454 includes an indication of the number of iterations of data detector circuit 425 and data decoder circuit 450 that have been applied to the received input, and an indication of the number of errors (i.e., violated checks) that remain in decoder output 452 after the end of the decoding process.

Figure 5:
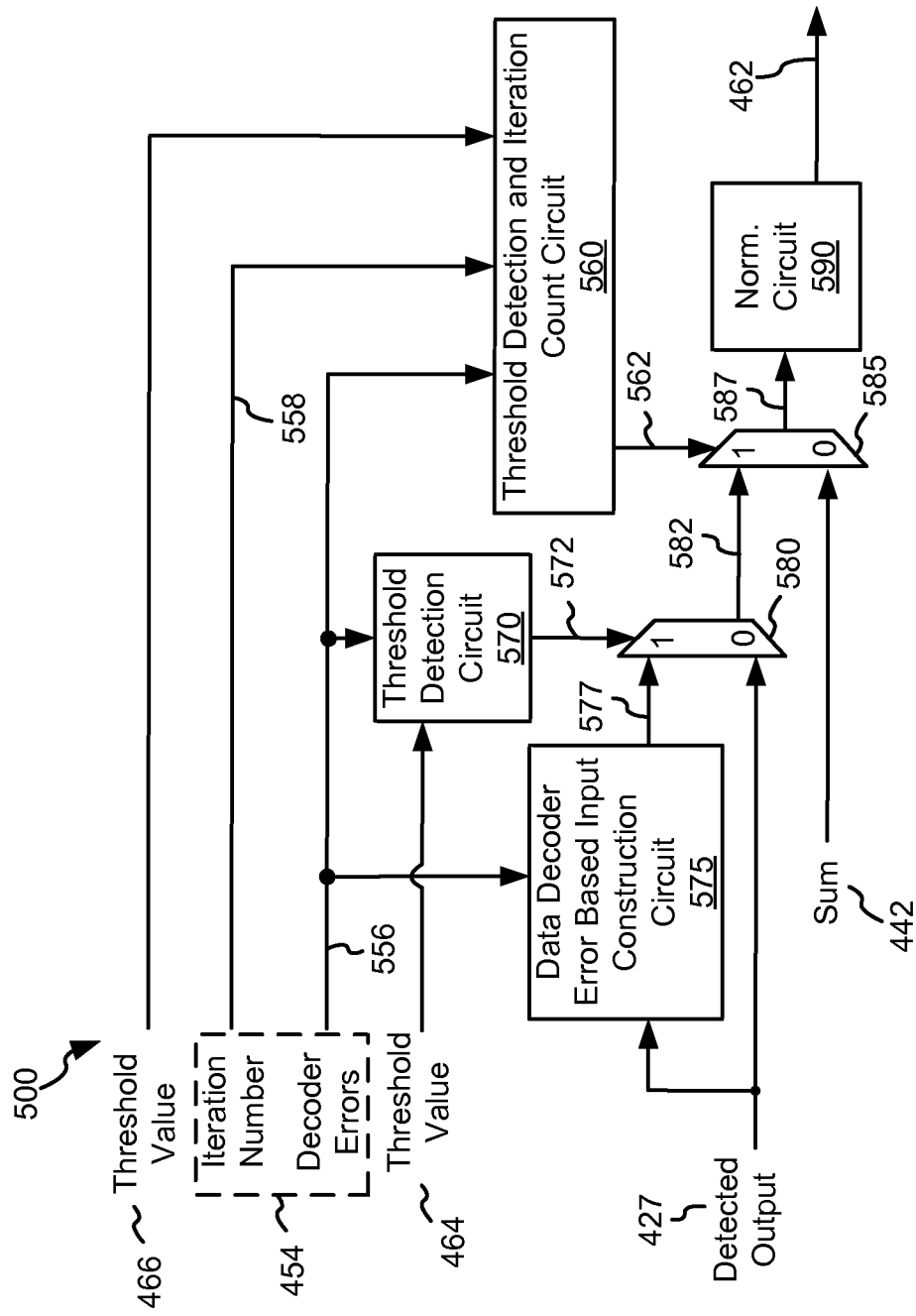
FIG. 5 is a detailed block diagram of a multi-path data detector to data decoder circuit in accordance with various embodiments of the present invention.

Turning to FIG. 5, a detailed block diagram of a multi-path data detector to data decoder circuit 500 is shown in accordance with various embodiments of the present invention. Multi-path data detector to data decoder circuit 500 includes a data decoder error based input construction circuit 575 that receives the number of unsatisfied decoder check equations (i.e., part of input status 454 from data decoder circuit 450) 556 and detected output 427 from data detector circuit 425. Data decoder error based input construction circuit 575 provides a reconstructed output 577 in accordance with the following equation:

Reconstructed Output 577={(Sign of Detected Output 427), (−2)(Number of Unsatisfied Decoder Check Equations 556)}' where the number of unsatisfied decoder check equations 556 received as part of input status 454 is the number of errors remaining at the completion of the last pass of the decoding process.

A threshold detection circuit 570 compares the number of unsatisfied decoder check equations 556 received as status input 454 from detector circuit 450 against a threshold value 464. In one particular embodiment of the present invention, threshold value 464 is eight (8). Where the number of unsatisfied decoder check equations 556 is less than threshold value 464, a selector output 572 is asserted as a logic '1' causing reconstructed output 577 to be selected as a first preliminary output 582 by a selector circuit 580. Otherwise, the selector output 572 is asserted as a logic '0' causing detected output 427 to be selected as first preliminary output 582. In one particular embodiment of the present invention, selector circuit 580 is a multiplexer circuit.

A threshold detection and iteration count circuit 560 compares the number of unsatisfied decoder check equations 556 against a second threshold, and determines whether the iteration number 558 received as part of status input 454 from data decoder circuit 450 mod N is equal to zero. In one particular embodiment of the present invention, N is four (4) and threshold value 466 is sixteen (16). Where the number of unsatisfied decoder check equations 556 is not less than threshold value 466 or the number of iterations 558 mod N is zero, a selector output 562 is asserted as a logic '0' causing sum 442 to be selected as a second preliminary output 587 by a selector circuit 585. Otherwise, selector output 562 is asserted as a logic '1' causing first preliminary output 582 to be selected as second preliminary output 587. In one particular embodiment of the present invention, selector circuit 585 is a multiplexer circuit. Second preliminary output 587 is provided to a normalization circuit 590 that normalizes the received input and provides the normalized result as decoder input 462.

Figure 6:
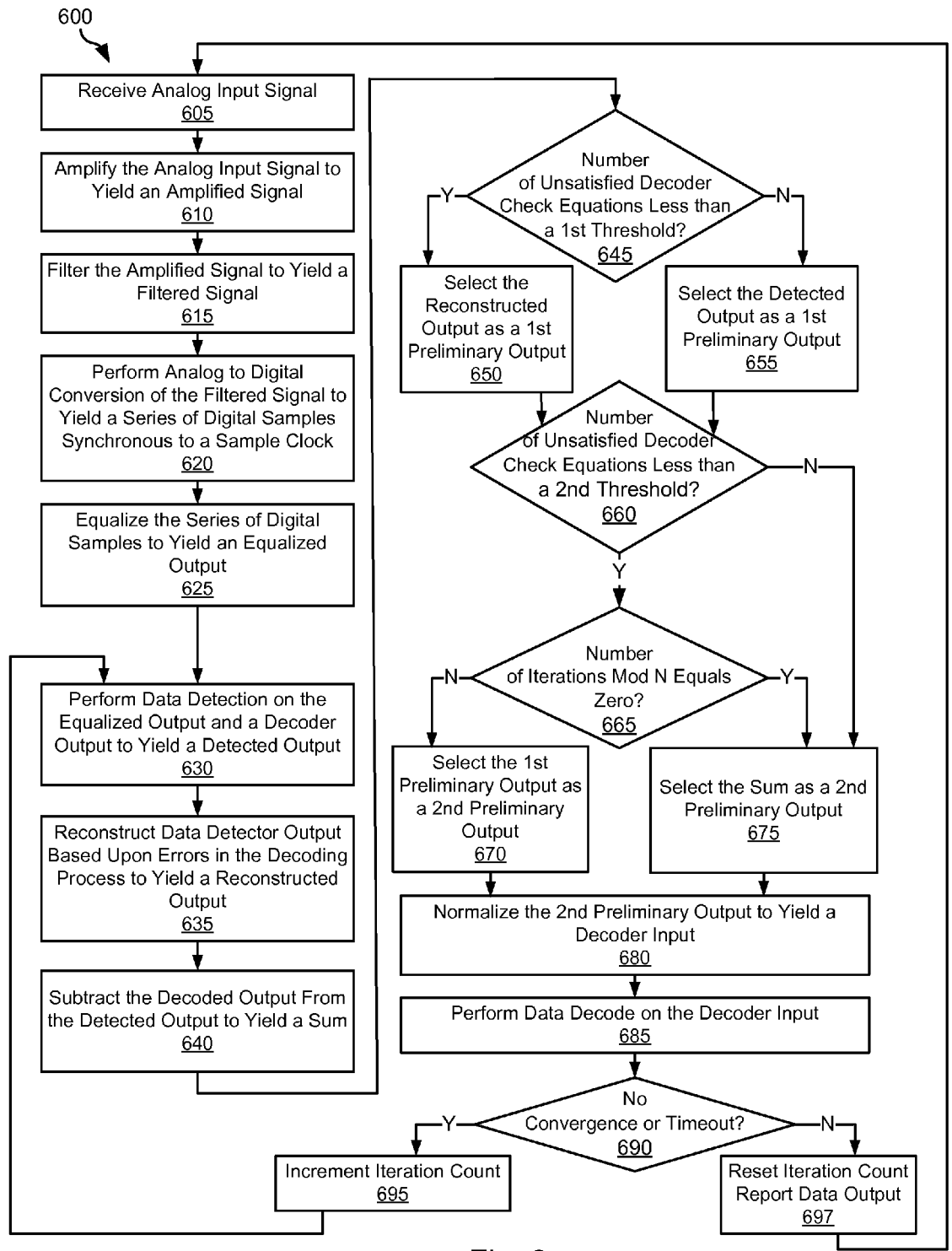
FIG. 6 is a flow diagram showing a method in accordance with some embodiments of the present invention for improved data processing.

Turning to FIG. 6, a flow diagram 600 shows a method in accordance with some embodiments of the present invention for improved data processing. Following flow diagram 600, an analog input signal is received (block 605). Analog input signal includes various information including synchronization information, user data, servo data and the like that is derived from a medium. The medium may be, but is not limited to, a magnetic storage medium or a wireless transmission medium. The analog input signal may be received, for example, from a read/write head assembly that senses information from a storage medium or from a receiver that receives information from some other type of medium. Based upon the disclosure provided herein, one of ordinary skill in the art will recognize a variety of sources of the analog input signal. The analog input signal is amplified to yield an amplified signal (block 610), and the amplified signal is filtered to yield a filtered signal (block 615). The aforementioned amplification and filtering may be done in either order, and may be done by an analog front end circuit as are known in the art. An analog to digital conversion process is applied to the filtered output to yield a series of corresponding digital samples (block 620). The series of digital samples are synchronous to a sampling clock, and represent a value of the analog input signal at each particular sampling instant. Based upon the disclosure provided herein, one of ordinary skill in the art will recognize a variety of analog to digital conversion processes that may be applied in accordance with different embodiments of the present invention. The series of digital samples are equalized to yield an equalized output (block 625). In some embodiments of the present invention, the equalization process is done using a digital finite impulse response filter circuit as are known in the art. Based upon the disclosure provided herein, one of ordinary skill in the art will recognize a variety of equalizer circuits and/or equalization processes that may be used in relation to different embodiments of the present invention.

A data detection process is applied to the equalized output to yield a detected output (block 630). In some embodiments of the present invention, the data detection process is a Viterbi algorithm data detection process. In other embodiments of the present invention, the data detection process is a maximum a posteriori data detection process. Based upon the disclosure provided herein, one of ordinary skill in the art will recognize a variety of data detection processes that may be applied in accordance with different embodiments of the present invention.

The data detector output is reconstructed based upon errors in the decoding process to yield a reconstructed output (block 635). The reconstructed output is created in accordance with the following equation:

Reconstructed Output={(Sign of Detected Output), (−2)(Number of Unsatisfied Decoder Check Equations)}' where the violated checks variable is the number of errors remaining at the completion of the last pass of the decoding process. The decoded output (i.e., the output from the decoder available from the last decoding pass) is subtracted from the detected output to yield a sum (block 640).

It is determined whether the number of errors (i.e., violated checks) from the decoding process is less than a first threshold level (block 645). In one particular embodiment of the present invention, the first threshold is selected as eight (8). Where the number of errors is less than the first threshold (block 645), the reconstructed output is selected as a first preliminary output (block 650). Otherwise, the detected output is selected as the first preliminary output (block 655). It is also determined whether the number of errors (i.e., violated checks) from the decoding process is less than a second threshold level (block 660). In one particular embodiment of the present invention, the first threshold is selected as sixteen (16). Where the number of errors is less than the second threshold (block 660), it is determined whether the number of iterations through the combination of the detector process and the decoder process mod N equals zero (block 665). In some embodiments of the present invention, the value of N is four (4). Where either the number of errors is not less than the second threshold (block 660) or the number of iterations mod N is zero (block 665), the sum is selected as a second preliminary output (block 675). Otherwise, where both the number of errors is less than the second threshold (block 660) and the number of iterations mod N is not zero (block 665), the first preliminary output is selected as the second preliminary output (block 670).

The selected second preliminary output is normalized (block 680) and provided to a data decoder that applies a decoding algorithm to yield the decoder output (block 685). In addition, after application of the decoding algorithm, a number of errors (i.e., violated checks) remaining at the end of the decoding process is indicated. In some embodiments of the present invention, the decoding algorithm is a low density parity check algorithm. Based upon the disclosure provided herein, one of ordinary skill in the art will recognize other decoding algorithms that may be used in relation to different embodiments of the present invention. It is determined whether the decoding algorithm converged (i.e., the number of remaining errors is zero) or if a timeout condition was satisfied (i.e., a maximum number of iterations through the combination of the data detector and the data decoder) (block 690). Where either a convergence or a timeout condition is achieved (block 690), the count of the number of iterations through the combination of the data detector and the data decoder is reset and the decoder output is provided as a data output (block 697). Otherwise, where neither a convergence nor a timeout condition is achieved (block 690), the count of the number of iterations through the combination of the data detector and the data decoder is incremented (block 695), and the processes of blocks 630-690 are repeated using the newly developed decoder output.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for performing defect detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscriber line systems. Therefore, the above description should not be taken as limiting the scope of the invention, which is defined by the appended claims.

What is claimed is:

1. A method for data processing, the method comprising:
receiving a data input;
performing a data detection on the data input and a decoder output to yield a detected output;
generating two or more preliminary inputs based at least in part on the detected output and an iteration count of the data decode, wherein generating two or more preliminary inputs includes:
comparing the number of unsatisfied decoder check equations with a threshold value to yield a first comparator output;
selecting one of an interim detected output and the detected output less the decoder output as a selected output based at least in part on the first comparator output;
comparing the number of unsatisfied decoder check equations with a second threshold value to yield a second comparator output;
selecting one of the interim detected output and a reconstructed output as the interim detected output based at least in part on the second comparator output;
calculating the iteration count mod N to yield a remainder output; and
wherein selecting one of the interim detected output and the detected output less the decoder output as the selected output includes selecting the interim detected output when the remainder output is equal to zero and the number of unsatisfied decoder check equations is less than the threshold value;

selecting one of the two or more preliminary inputs as a decoder input based at least in part on a number of unsatisfied decoder check equations; and performing a data decode on the decoder input to yield the decoder output and the number of unsatisfied decoder check equations.

2. The method of claim 1, wherein N is four.

3. The method of claim 1, wherein the reconstructed output is calculated in accordance with the following equation:

{(Sign of Detected Output), (−2)(Number of Unsatisfied Decoder Check Equations)}.

4. A data processing system, the data processing system comprising:
a data detector circuit operable to apply a data detection algorithm to a data input to yield a detected output;
a data decoder circuit operable to apply a decoding algorithm to a decoder input to yield a decoder output and a status input;
a multi-path circuit including:
a first threshold detection circuit operable to compare the status input with a first threshold value to yield a first comparator output;
a first selector circuit operable to provide one of a reconstructed output derived from the detected output or the detected output as an interim detected output;
a second threshold circuit operable to compare the status input with a second threshold value to yield a second comparator output; and
a second selector circuit operable to provide one of the interim detected output or the detected output less the decoded output as a selected output based at least in part on the second comparator output.

5. The data processing system of claim 4, wherein the decoder input is derived from the selected output.

6. The data processing system of claim 5, wherein the system further comprises:
a normalization circuit operable to normalize the selected output to yield the decoder input.

7. The data processing system of claim 4, wherein the status input is a number of unsatisfied decoder check equations; and wherein the reconstructed output is generated based upon a sign of the detected output and the number of unsatisfied decoder check equations.

8. The data processing system of claim 7, wherein the reconstructed output is calculated in accordance with the following equation:

{(Sign of Detected Output), (−2)(Number of Unsatisfied Decoder Check Equations)}.

9. The data processing system of claim 4, wherein the status input is a number of unsatisfied decoder check equations.

10. The data processing system of claim 4, wherein the first selector circuit is a first multiplexer circuit, and wherein the second selector circuit is a second multiplexer circuit.

11. The data processing system of claim 4, wherein the status input is a number of unsatisfied decoder check equations, and wherein the multi-path circuit further comprises:
an iteration count circuit operable to indicate a number of iterations of the data decoder circuit mod N to yield a divided output; and
wherein the second selector circuit is operable to provide the interim detected output when the divided output is equal to zero and the number of unsatisfied decoder check equations is less than the threshold value.

12. The data processing system of claim 11, wherein N is four.

13. The data processing system of claim 4, wherein the second selector circuit is operable to provide the reconstructed output as the interim detected output when second comparator output indicates that the status input is less than the second threshold value.

14. The data processing system of claim 13, wherein the first threshold value and the second threshold value are programmable.

15. The data processing circuit of claim 4, wherein the data processing system is implemented as an integrated circuit.

16. The data processing circuit of claim 4, wherein the data processing system is incorporated in a storage device.

17. A storage system, the storage system comprising:
a storage medium;
a read/write head assembly operable to sense information from the storage medium and to provide a corresponding continuous signal;
an analog front end circuit operable to process the continuous signal to yield an analog input;
an analog to digital converter circuit operable to sample the analog input synchronous to a sampling clock to yield a set of digital samples;
an equalizer circuit operable to equalize the set of digital samples and to provide a corresponding equalized output;
a data detector circuit operable to apply a data detection algorithm to the equalized output to yield a detected output;
a data decoder circuit operable to apply a decoding algorithm to a decoder input to yield a decoder output and a status input;
a multi-path circuit operable to provide the decoder input based at least in part on the detected output and the status input, wherein the multi-path circuit includes:
a first threshold detection circuit operable to compare the status input with a first threshold value to yield a first comparator output;
a first selector circuit operable to provide one of a reconstructed output derived from the detected output or the detected output as an interim detected output;
a second threshold circuit operable to compare the status input with a second threshold value to yield a second comparator output; and
a second selector circuit operable to provide one of the interim detected output or the detected output less the decoded output as a selected output based at least in part on the second comparator output.

18. The storage device of claim 17, wherein the status input is a number of unsatisfied decoder check equations; and wherein the reconstructed output is generated based upon a sign of the detected output and the number of unsatisfied decoder check equations.

19. The storage system of claim 18, wherein the reconstructed output is calculated in accordance with the following equation:

{(Sign of Detected Output), (−2)(Number of Unsatisfied Decoder Check Equations)}.

20. The storage system of claim 17, wherein the multi-path circuit further comprises:
an iteration count circuit operable to indicate a number of iterations of the data decoder circuit mod N to yield a divided output; and
wherein the second selector circuit is operable to provide the interim detected output as the selected output when the divided output is equal to zero and the number of unsatisfied decoder check equations is less than the threshold value.

21. The storage system of claim 17, wherein the reconstructed output is calculated in accordance with the following equation:

{(Sign of Detected Output), (−2)(Number of Unsatisfied Decoder Check Equations)}.

\* \* \* \* \*